United States Patent [19]

Damon

[11] 4,338,717
[45] Jul. 13, 1982

[54] METHOD FOR FABRICATING A LIGHT EMITTING DIODE DISPLAY SOCKET

[75] Inventor: Neil F. Damon, Fort Pierce, Fla.

[73] Assignee: Augat Inc., Attleboro, Mass.

[21] Appl. No.: 183,181

[22] Filed: Sep. 2, 1980

[51] Int. Cl.³ .............................................. B23K 31/02
[52] U.S. Cl. ........................................ 29/839; 29/837;
228/180 R; 339/17 CF; 339/17 LC
[58] Field of Search ............... 228/136, 173 R, 180 R;
29/830, 837, 838, 839, 840; 339/17 CF, 17 LC

[56] References Cited

U.S. PATENT DOCUMENTS

| | | | |
|---|---|---|---|
| 3,516,155 | 6/1970 | Smith | 29/839 |
| 3,726,007 | 4/1973 | Keller | 29/840 |
| 4,076,165 | 2/1978 | Larasiewicz et al. | 228/136 |
| 4,196,957 | 4/1980 | Benasutti | 339/17 LC X |
| 4,200,347 | 4/1980 | Sinclair et al. | 339/17 LC X |

FOREIGN PATENT DOCUMENTS 2720293  9/1978  Fed. Rep. of Germany ........ 29/839

OTHER PUBLICATIONS

"LED Sockets and Ganged Units", Augat Data Sheet, 1972.

Primary Examiner—Gil Weidenfeld
Assistant Examiner—Fred A. Silverberg
Attorney, Agent, or Firm—Weingarten, Schurgin & Gagnebin

[57] ABSTRACT

A method for making a light emitting diode display socket. A standard receiving socket with contact terminals extending in a dual-in-line configuration from one side thereof is coupled to one edge of each of two printed circuit cards having individual terminals extending from another edge. The contact terminals of the socket enter appropriate holes along the one edge of the printed circuit cards. The assembly is then wave soldered to permanently connect the individual terminals and the socket contact terminals to the printed circuit cards. The cards are then folded toward each other to a parallel, spaced confronting position and they are secured in that position for final permanent assembly.

8 Claims, 5 Drawing Figures

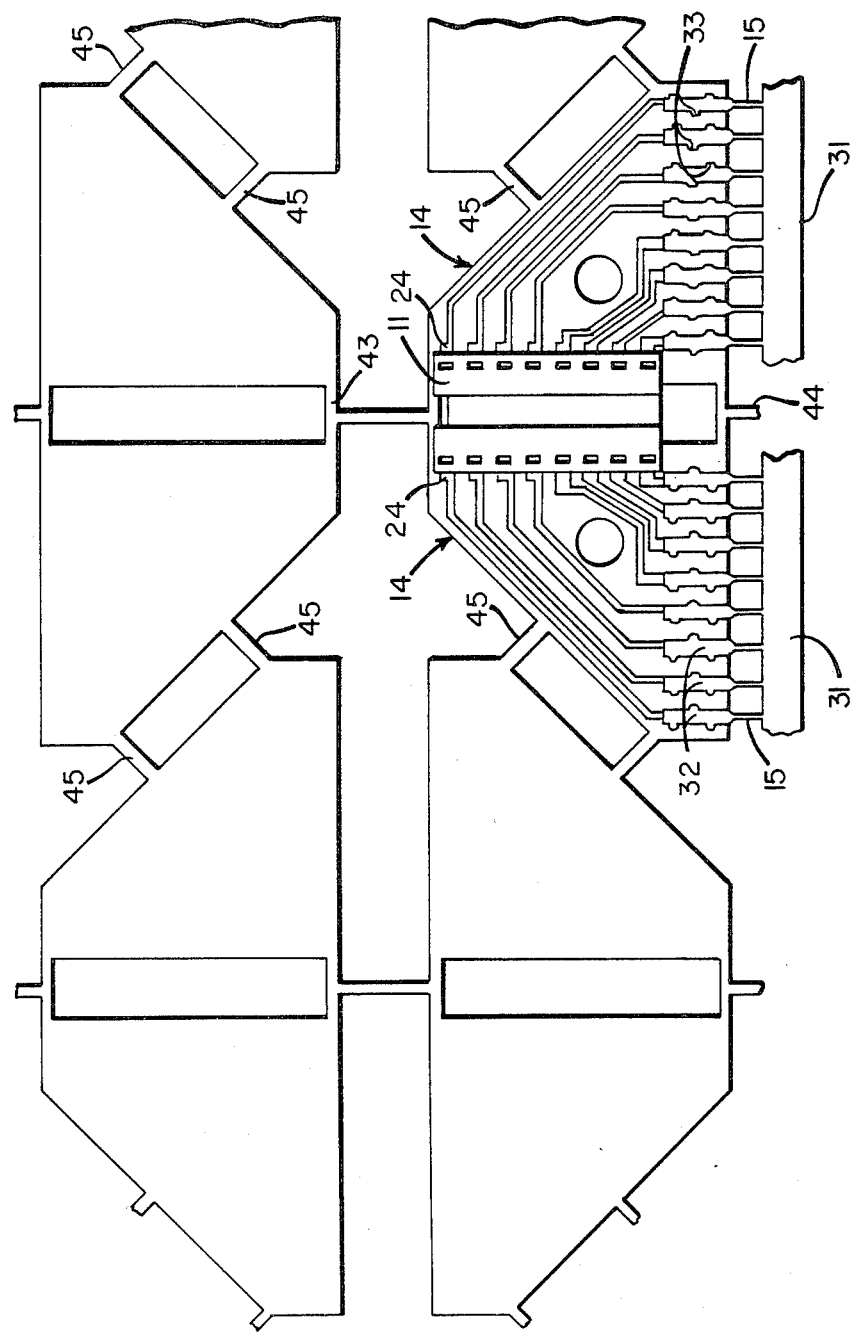

METHOD FOR FABRICATING A LIGHT EMITTING DIODE DISPLAY SOCKET

FIELD OF THE INVENTION

This invention relates generally to electrical interconnection devices and more particularly concerns a method for making a light emitting diode socket.

DISCUSSION OF THE PRIOR ART

Light emitting diode sockets of the type fabricated by the method of this invention have been available for some time. However, they have been relatively complex and expensive to make and required a large number of hand soldering operations. Such sockets are used to provide a plug-in feature for light emitting diodes having a dual-in-line configuration of terminals extending from one side thereof. These sockets are employed where the diode cannot conveniently be plugged directly into a printed circuit board which provides the circuitry for selectively energizing or controlling the diodes as desired for alphabetical or numerical display. It is often necessary to orient the light emitting diodes at an angle with respect to the control printed circuit board.

One prior art socket employs a receiving socket having machined terminals with the portions of the terminals projecting from the surface of the receiving socket being split to receive the edge of a printed circuit card, the card having a contact pad engaged by each split terminal. A hand soldering operation is then accomplished to permanently connect each terminal to each contact pad on the printed circuit card. Additionally, terminals on another edge of the printed circuit card has tabs inserted into holes intercepting the contact pads along the other edge and the tabs are then crimped to temporarily retain the terminal in place. Each of these terminals is then soldered, making a total of 64 hand soldered joints for a conventional 16-pin socket. Furthermore, in this device the machined contact terminals on the receiving socket are relatively expensive, resulting in a relatively expensive final product.

SUMMARY OF THE INVENTION

It is a primary object of this invention to provide a method for inexpensively fabricating a light emitting diode display socket. According to the invention, holes are formed in contact pads along one edge of printed circuit cards for receiving the projecting terminals of a receiving socket. These projecting terminals are fabricated of stamped metal which is relatively easily deformable. After the receiving socket terminals are inserted and soldered into holes in two cards which are arranged in parallel planer adjacent relationship with respect to each other, the two boards are foled into spaced, parallel confronting relationship and fixed in that configuration. Individual terminals are crimped in place along another edge of the printed circuit cards and they may also be soldered at the same time as the terminals of the receiving socket, before the folding step. Thus, less expensive materials are used and there is one simultaneous soldering process instead of 64 individual hand soldering operations.

BRIEF DESCRIPTION OF THE DRAWING

The advantages, objects and features of this invention will be more readily appreciated from the following detailed description when read in conjunction with the accompanying drawing in which:

FIG. 5 is a partial plan view of a multiplicity of the FIG. 2 configurations prepared for mass wave soldering.

DESCRIPTION OF THE PREFERRED EMBODIMENT

Figure 1:
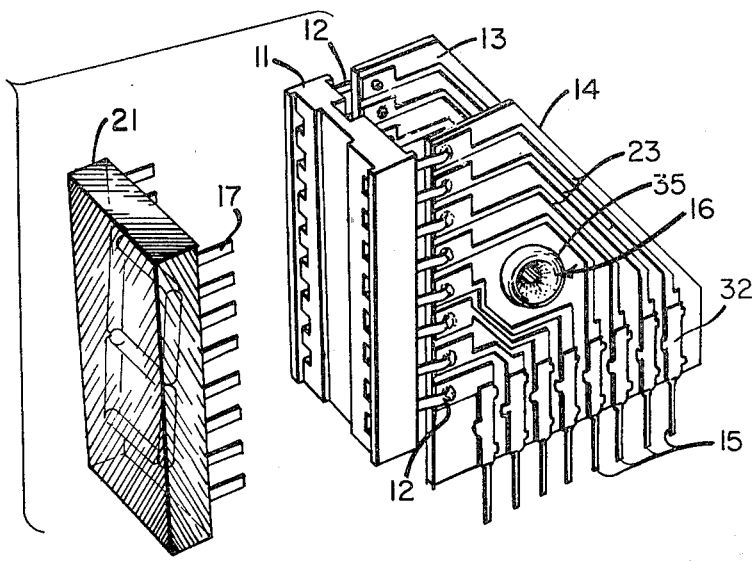
FIG. 1 is a perspective view of a light emitting diode display socket manufactured in accordance with the method of this invention.

With reference now to the drawing and more particularly to FIG. 1 thereof, there is shown a light emitting diode display socket adapted to receive a light emitting diode having a dual-in-line configuration of terminals extending from one side thereof. The didoe itself is shown in spaced relationship with respect to the receiving socket portion of the unit as constructed in accordance with the invention. Receiving socket 11 has a plurality of contact terminals 12 connected to printed circuit cards 13 and 14. Extending from another edge of the printed circuit cards are individual terminals 15, the cards being maintained in spaced parallel relationship by a spacer member 16. The receiving socket is adapted to receive the dual-in-line configuration of terminals 17 of light emitting diode (LED) 21 for display purposes. The LED may be adapted for alphabetical or numeric display, or both, and conventional circuitry is employed to control the display of the LED.

Figure 4:
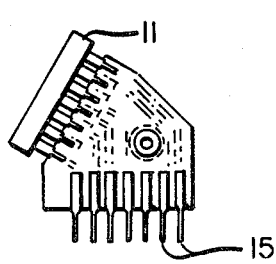
FIG. 4 is an alternative embodiment of a socket made in accordance with this method.

The socket assembly of this invention is for purposes of enabling the LED to provide the desired display at a desired angle, which angle would normally not be expected to be parallel with the control printed circuit board. Thus it is often necessary to provide a pluggable receiving socket which is displaced at some angle with respect to the board. The socket assembly of this invention is adapted to provide this pluggable receiving socket and to provide interconnection of the LED into the control board. The control board itself is not shown but is a conventional device which would normally have other electronic components such as integrated circuit packages mounted thereto and have means for receiving an appropriate source of power. With reference to FIG. 4 it may be seen that the socket assembly may be arranged at an angle of other than the 90° angle shown in FIG. 1.

Figure 2:
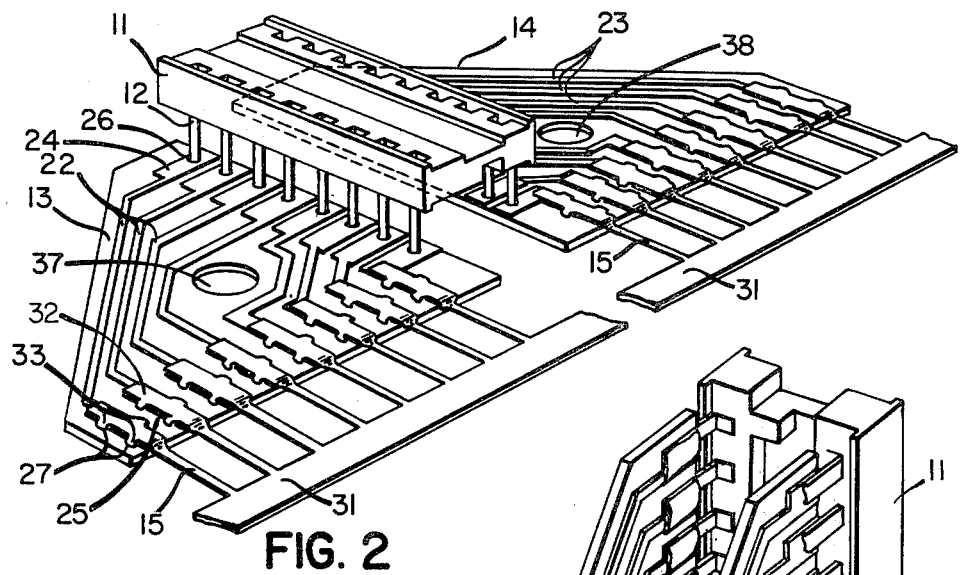
FIG. 2 is a perspective of the assembly at an intermediate time in the method.

With reference to FIG. 2, the steps of the invention will be made clear. Printed circuit cards 13 and 14 having a generally triangular shape are formed with respective printed circuit paths 22 and 23 interconnecting contact pads along two edges of the card. For purposes of convenience, printed circuit card 13 will be referred to, it being understood that printed circuit card 14 is a substantial duplicate thereof. Circuit path 22 interconnects one contact pad 24 along one edge of the card to another pad 25 along another edge of the card. In this particular configuration, the two edges of the card on which contact pads are located are adjacent one another but this is not necessary. The printed circuit cards may take on shapes and configurations which are not triangular, it only being necessary that there be two sets of contact pads interconnected by the circuit paths 22.

Each of contact pads 24 are intercepted by a through hole 26. For purposes of manufacturing simplicity, and for possible planned redundancy, both sides of the printed circuit card may be formed with duplicate contact pads and circuit paths. It may thus be desirable that holes 26 be plated-through holes to interconnect the top and bottom circuitry. The other contact pads 25 may have one or more through holes 27 intercepting them. These holes will normally be along the edges of the contact pads for purposes which will become clear hereinbelow.

Terminals 15 may be stamped out of a sheet of material and remain connected to a strip 31, or a segment thereof, until they are mounted to the printed circuit cards.

The assembly process of the invention will now be described. Printed circuit cards 13 and 14 are placed in spaced planar relationship with the edges containing pads 24 being in parallel juxtaposition. The printed circuit cards may be placed in this position on some type of support or jig, the configuration of which is not important to the invention. Strip 31 is placed in position so that the wide portions 32 of terminals 15 overlie contact pads 25. Terminals 15 are formed with one or more tabs 33 projecting downwardly with respect to the plane of the printed circuit cards of FIG. 2 so that they are received in holes 27 which intercept contact pads 25. These tabs are preferably then crimped to temporarily retain the terminals on the printed circuit cards although this crimping step is not absolutely necessary. A conventional cutting tool may then be employed to separate terminals 15 from strip 31 which strip is then discarded or recycled. Receiving socket 11 is placed in position over contact pads 24 so that contact terminals 12 project into holes 26 in the contact pads. The assembly of printed circuit cards 13, 14, terminals 15 and receiving socket 11 may be held together by a simple mechanical jig, the configuration of which is not important to the invention, and placed in a wave soldering machine so that all of the contact pads are soldered to the respective terminals 15 and contact terminals 12. Any suitable type of mass soldering method may be used in place of wave soldering.

Figure 3:
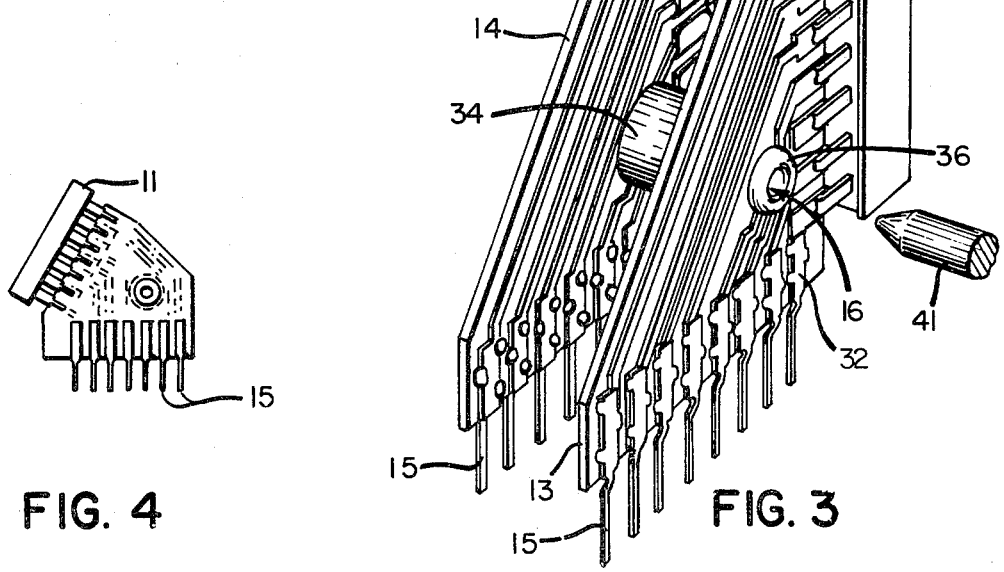
FIG. 3 is a perspective of the device showing the final step.

After the soldering step, printed circuit cards 13 and 14 are then rotated or folded toward one another into spaced parallel relationship and spacer member 16 having body portion 34 and reduced diameter end portions 35, 36 is inserted between the printed circuit cards with the reduced diameter portions of the spacer member projecting through holes 37 and 38 in printed circuit cards 13 and 14 respectively. As shown in FIG. 3, a heated tool tip 41 is applied against each end of spacer member 16 to heat stake those ends and thereby permanently fix the printed circuit card in spaced parallel confronting relationship. While heat staking is preferred, other means of enlarging the head of the spacer member may be employed. As an alternative to staking, a small washer could be snapped over the appropriately formed ends of the spacer member.

Instead of using a jig to wave solder individual FIG. 2 assemblies, it is possible that after the printed circuit cards are formed in pairs on a large board 42, with circuit paths 22, 23, contact pads 24, 25 and the appropriate holes therein (FIG. 5), they may be incompletely die cut, having support bridges 43, 44 and 45. The contacts 15 and receiving socket 11 may be applied as before and the entire board of a large number of FIG. 2 assemblies wave soldered simultaneously. In such instance, individual jigs are not necessary.

In view of the above description, it is likely that modifications and alternatives will occur to those skilled in the art which are within the scope of this invention. For example, terminals 15 are shown with three tabs 33 but any appropriate number of tabs may be used. Terminals 15 may be individually mounted and crimped to the printed circuit cards rather than using a strip 31. Also, of course, other means may be used to retain the cards in spaced parallel relationship in the configuration shown in FIGS. 1 and 4, rather than tubular spacer member 16. It may be possible that other configurations than dual-in-line may be used, so that more than two printed circuit cards may be necessary. It will be immediately apparent that several of these sockets will be arranged in closely adjacent relationship on the control circuit board to provide a display of several digits, as in a calculator.

What is claimed is:

1. A method for fabricating a socket for a light emitting diode having a dual-in-line configuration of terminals extending from one side thereof, the socket being comprised of a receiving socket having contact terminals extending from one side thereof in dual-in-line configuration, said method comprising the steps of:
    forming at least two printed circuit cards with a plurality of contact pads adjacent each of first and second edges, one contact pad at each said edge being connected by means of a printed circuit path to a pad at the other said edge;
    forming a first hole through each of said contact pads along said first edge of each said printed circuit card;
    forming at least one second hole intercepting each of said contact pads along said second edge of each said printed circuit card;
    aligning first and second said printed circuit cards in adjacent spaced planar relationship with said first edges in parallel juxtaposition and said second edges aligned;
    placing a terminal against each said contact pad along said second edge, said terminal having a tab projecting into said at least one hole intercepting said contact pads;
    inserting said contact terminals of said receiving socket into said holes in said pads along said first edge of said printed circuit cards, said contact terminals in one line being inserted into said holes in one of said printed circuit cards;
    simultaneously soldering said terminals and said contact terminals to said printed circuit cards; then
    rotating said first and second printed circuit cards toward each other to a parallel spaced confronting relationship thereby deforming said contact terminals; and then
    fixing said first and second printed circuit cards permanently in said spaced relationship.

2. The method recited in claim 1 and comprising the further step of temporarily holding together the assembly of said receiving socket printed circuit cards and terminals.

3. The method recited in claim 1, wherein said second hole forming step forms a hole along one side of each said second edge contact pad and two spaced holes along the other side of each said second edge contact pad, said terminal having a tab projecting into each said second holes.

4. The method recited in either claim 1, 2 or 3 and comprising the further step of crimping said tab to hold said terminals to said printed circuit cards prior to said soldering step.

5. The method recited in claim 4 wherein said soldering step is accomplished by wave soldering.

6. The method recited in claim 1 wherein said fixing step is accomplished by inserting a spacer member between said first and second printed circuit cards with an end of said spacer member extending through a hole in each said printed circuit card, wherein each said end of said spacer member is staked for permanent connection.

7. A method for fabricating a socket for a light emitting diode having a dual-in-line configuration of terminals extending from one side thereof, the socket being comprised of a receiving socket having contact terminals extending from one side thereof in dual-in-line configuration, said method comprising the steps of:

forming a multiplicity of pairs of printed circuit cards on a large printed circuit board, each said printed circuit card being formed with a plurality of contact pads adjacent each of first and second edges, one contact pad at each said edge being connected by means of a printed circuit path to a pad at the other said edge;

partially separating said printed circuit cards from said large printed circuit board;

forming a first hole through each of said contact pads along said first edge of each said printed circuit card;

forming at least one second hole intercepting each of said contact pads along said second edge of each said printed circuit card, first and second printed circuit cards in each said pair being in adjacent spaced planar relationship with said first edges being in parallel juxtaposition and said second edges being aligned;

placing a terminal against each said contact pad along said second edge, said terminal having a tab projecting into said at least one hole intercepting said contact pads;

inserting said contact terminals of said receiving socket into said holes in said pads along said first edge of said printed circuit cards, said contact terminals in one line being inserted into said holes in one of said printed circuit cards;

simultaneously soldering said terminals and said contact terminals to said printed circuit cards in each of said pairs; then rotating said first and second printed circuit cards in each said pair toward each other to a parallel spaced confronting relationship; and then fixing said first and second printed circuit cards permanently in said spaced relationship.

8. The method recited in claim 7 and comprising the further step of separating each of said pairs of printed circuit cards from said large printed circuit board prior to said rotating step.

* * * * *